United States Patent [19]
Widdau et al.

[11] Patent Number: 5,034,905
[45] Date of Patent: Jul. 23, 1991

[54] DIVIDER CIRCUIT USING ANALOG-DIGITAL CONVERTER

[75] Inventors: Stefan Widdau, Blankenheimerdorf; Rainer Kurz; Jakob Schelten, both of Jülich; Andreas Scholz, Aachen, all of Fed. Rep. of Germany

[73] Assignee: Kernforschungungsanlage Julich Gesellschaft Mit Beschrankter Haftung, Julich, Fed. Rep. of Germany

[21] Appl. No.: 353,108

[22] Filed: May 17, 1989

[30] Foreign Application Priority Data

Jan. 28, 1989 [DE] Fed. Rep. of Germany ... 8900990[U]

[51] Int. Cl.$^5$ .................. G06J 1//00; H03M 1/36; G01R 19/10
[52] U.S. Cl. ................... 364/606; 324/140 D; 341/155
[58] Field of Search ............... 341/131, 139, 155, 126, 341/159; 324/140 D, 140 R; 328/161; 364/606

[56] References Cited

U.S. PATENT DOCUMENTS 3,749,894 7/1973 Avdeef ........................ 364/606
4,125,896 11/1978 Metcalf ....................... 364/606

FOREIGN PATENT DOCUMENTS 170972 9/1984 Japan ......................... 364/606

*Primary Examiner*—Stephen M. Baker
*Attorney, Agent, or Firm*—Herbert Dubno

[57] ABSTRACT

A circuit arrangement for dividing an input signal A by a signal B, for example for use in localizing radiation detection, has a dividing analog-to-digital converter receiving an addition signal $A + q \times B$ as well as the divisor signal B to form the quotient $(A + q \times B)/B$ from which a digital random value r is subtracted, where r corresponds to q. The ADC can be a Flash ADC and the resulting circuit has good differential linearity and is fast.

12 Claims, 2 Drawing Sheets

DIVIDER CIRCUIT USING ANALOG-DIGITAL CONVERTER

FIELD OF THE INVENTION

Our present invention relates to a divider circuit and, more particularly, to a circuit arrangement having a dividing analog-to-digital converter which can be used for the division of an input signal A by a respective reference signal B assigned to that input signal.

BACKGROUND OF THE INVENTION

A division of signals of the type described above is required for localization of radiation fields utilizing detector systems which can pick up radiation from the field simultaneously, namely, so-called localizing detector systems. By the provision of such detectors which simultaneously pick up radiation from the fields, it is possible to significantly shorten measuring times for localization of points in the radiation field with respect to operations with individual detectors which may be driven in a column-and-row format as is the case, for example, with thyroid gland scans in medicine.

It is known, for example, to provide multiple sources of radiation or radioactive implants with appropriate detectors for effecting a thyroid gland scan utilizing techniques relating to a radionuclide imaging, tomography, emission-computed tomography and the like. An example of a detector system for determining locality by simultaneously picking up radiation at a field from a plurality of detectors is the Anger camera for radiation fields, utilized in medicinal diagnostics.

A particular field of use for location-determining detectors is the field of scientific and technological research utilizing directed or non-directed radiation, for example for the reconstruction of three-dimensional images from two-dimensional sections provided by two-dimensional tomography in nondestructive testing and evaluation of materials and bodies.

The signal processing for all location-determining detector system's involves pulse division.

This can be effected separately with analog dividers and analog-to-digital converters provided at the outputs of the analog dividers or by numerical division following digitization of the dividend and divisor signals. Both processes are, however, relatively slow and expensive since the analog process requires pulse stretchers and the numerical process requires hard-wired calculators or computers.

Another type of signal processing in which the division and digitalizaton can be effected in a single step can be carried out in principle with a dividing analog-to-digital (ADC) whose reference potential is proportional to the signal level of the divisor and is modified to always be proportional to the signal level of the divisor.

When a dividing ADC is used in accordance with the Wilkinson process, excellent differential linearity is obtained. However, the process is relatively slow since the divisor signal may be subjected to a stretcher.

If division is carried out using an ADC operating in accordance with the principles of the successive approximation process, a stretching of the divisor signal is still required. As a consequence, the process is also slow. In addition, the differential linearity $\pm \frac{1}{2}$ LSB (least significant bit) is poor. In principle, the fastest ADC is a parallel ADC (Flash) which can generate simultaneously n-bit digital information with $2^n - 1$ comparators. If such an ADC is operated as a divider, no stretcher is required and as a consequence, the division-digitalization process is extremely fast. However, the differential linearity with $\pm \frac{1}{2}$ LSB is unacceptable.

An averaging process utilizing an ADC is described in the prior art (see Cottini et al, *A New Method for Analog to Digital Conversion*, Nuclear Instruments and Methods, Vol. 24 (1963), pages 241–242) primarily for ADCs utilizing successive approximation principles whereby for multiple channel analyzers, a relatively short pulse-height-independent deadtime with good differential linearity will result.

The relatively short pulse-height-independent deadtime guarantees that a successive approximation process can be effected and the requisite good linearity achieved. For dividing ADCs, however, this process cannot be used.

OBJECT OF THE INVENTION

It is, therefore, the principal object of the present invention to provide a circuit for the purposes described which can effect division and digitalization in a particularly rapid manner and with good differential linearity.

SUMMARY OF THE INVENTION

This object and others which will become apparent hereinafter is attained, in accordance with the present invention, in a divider circuit for the division of an input signal A by a respective reference signal B which comprises:

a dividing analog-to-digital converter receiving the reference signal B as a divisor input;

a multiplying digital-to-analog converter having an input receiving the reference signal B and a signal q representing an analog value of a selected number for the respective input signal A and such that $(A + q \times B)/B$ lies in a dynamic range of the analog-to-digital converter, the multiplying digital-to-analog converter forming an output product $q \times B$;

an adder connected to the multiplying digital-to-analog converter and receiving as one input the input signal A and as another input the product $q \times B$ to form a sum $(A + q \times B)$, the adder being connected to the dividing analog-to-digital converter to supply the sum as a dividend thereto whereby the dividing analog-to-digital converter has an output at which a quotient $(A + q \times B)/B$ is formed; and a subtractor connected to the output of the dividing analog-to-digital converter for subtracting from the quotient $(A + q \times B)/B$ a signal r representing a whole number corresponding to the analog value q, whereby an output representing a difference $[(A + q \times B)/B] - r$ is formed as a result for division of the input signal A by the respective reference signal B.

The circuit arrangement according to the invention ensures an extremely responsive division and digitalization with good differential linearity of the results. No stretcher is required except in the case of an ADC which is expected to yield extremely high resolutions.

The effect of the present invention is attained because instead of the division in the ADC being effected directly to form the quotient A/B, the quotient $(A + q \times B)/B$ is formed in the dividing ADC and the value r corresponding to the value q is then subtracted from the result.

In pulse processing operations, the product signal $(q \times B)$ is generated in the multiplying digital-to-analog converter (DAC) receiving as the reference potential a voltage corresponding to the signal B. In that case, averaging is effected over a portion of the channels of the ADC whereby for a predetermined resolution ($R=2^n-1$) a value is selected for r which lies between 0 and $2^m-1$, whereby m is less than n. For example, $m=4$ and $n=8$ so that averaging is effected over 16 channels with a DAC of 256 channels.

The analog summation signal $A+q\times B$ is then fed to the dividing ADC whose reference signal also is equal to the signal B.

The digital output of the ADC is then the quotient $(A+q\times B)/B$ from which the digital value r is subtracted. The digital output following the subtraction thus corresponds to the value A/B, i.e. the result of then dividing signal A by the signal B.

By a corresponding choice of the value r during the pulse processing, other comparators in the ADC are enabled. Based upon this averaging, the differential linearity is improved. For example, with an 8-bit ADC and an arbitrary number r, between 0 and 15 (4 bit), a differential linearity of 2% will result whereas without averaging the differential linearity would be 30%. The differential linearity improvement, therefore, is about equal to the factor $2^m-1$.

As circuit elements for generating the selected value r, for addition of the analog signals for $q\times B$ to the input signal A, and for subtraction of the digital number r, specific circuits may be provided. For example, the divider circuit as previously described can include an incremental register being connected to the DAC and subtractor. The adder is preferably an analog adder while the subtractor is preferably a digital subtractor. The analog-to-digital circuit is preferably a Flash ADC.

BRIEF DESCRIPTION OF THE DRAWING

The above objects, features and advantages of our invention will become more readily apparent from the following description, reference being made to the accompanying drawing in which.

SPECIFIC DESCRIPTION

Figure 1:
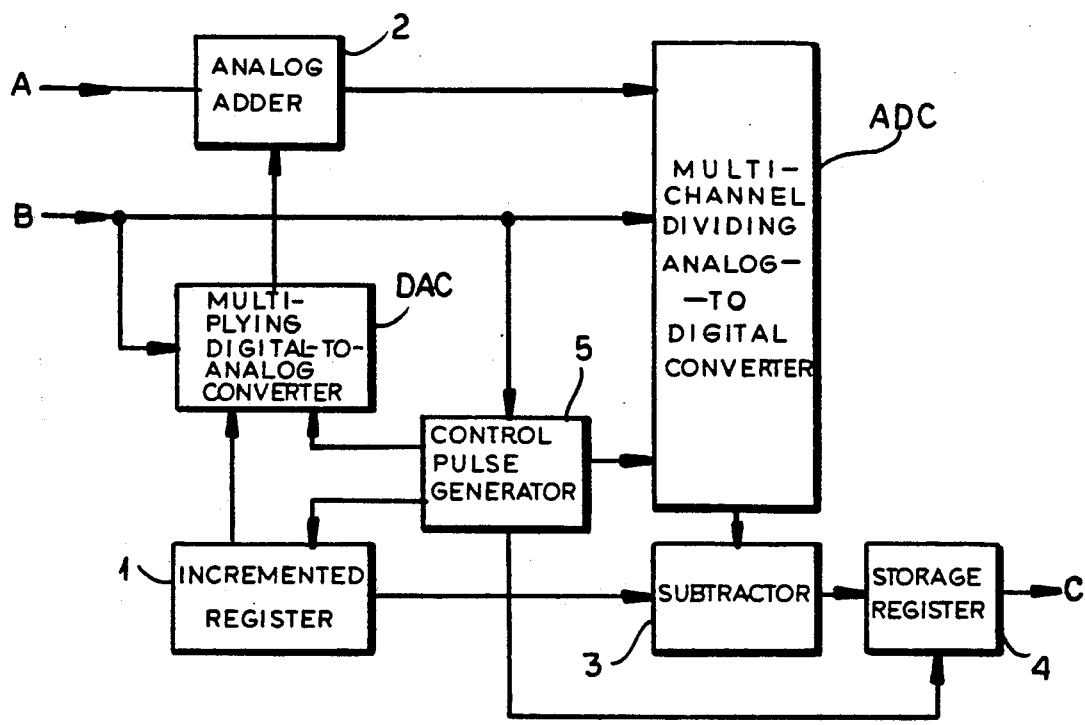
FIG. 1 is a block diagram of the circuit of the invention.

As can be seen from FIG. 1, the signal B forming the divisor is fed both to a dividing analog-to-digital converter ADC and to a multiplying digital-to-analog converter DAC as the respective reference signals.

An incremented register 1 feeds the digital value r to the DAC as a multiplier for the signal B. The resulting output is the product $q\times B$ which is supplied to an analog summer or adder 2 receiving as its other the input signal A.

The addition result corresponding to $(A+q\times B)$ is then fed to the ADC which effects a division of the digital information therein in accordance with the relationship $(A+q\times B)/B$.

The digital value r is fed by the incremental register 1 also to a subtractor which forms the difference $[(A+q\times B)/B]-r=A/B$. The output corresponding to this difference can be stored in a temporary storage register or memory 4.

The timing signals, for example, the converter pulse for the ADC, the trigger pulse for the incrementing register 1 and the transfer pulse for the storage register 4 a well as the write signal for the multiplying DAC are supplied by the control pulse generator 5 which is enabled in turn by the divisor signal B.

Figure 2A:
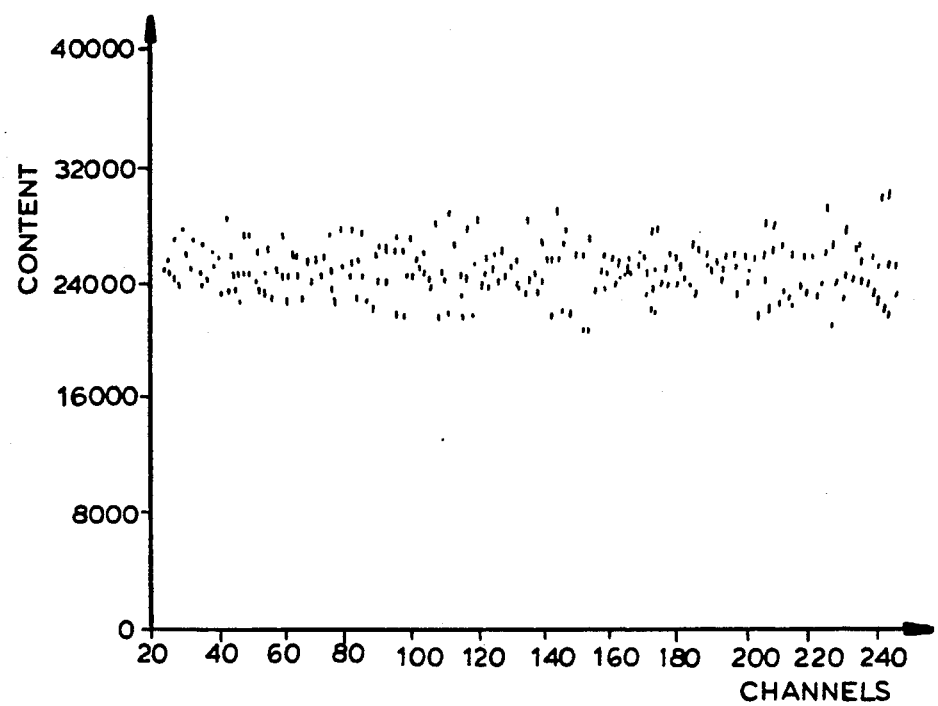
FIG. 2a is a plot of a nonaveraged output of the dividing ADC.
Figure 2B:
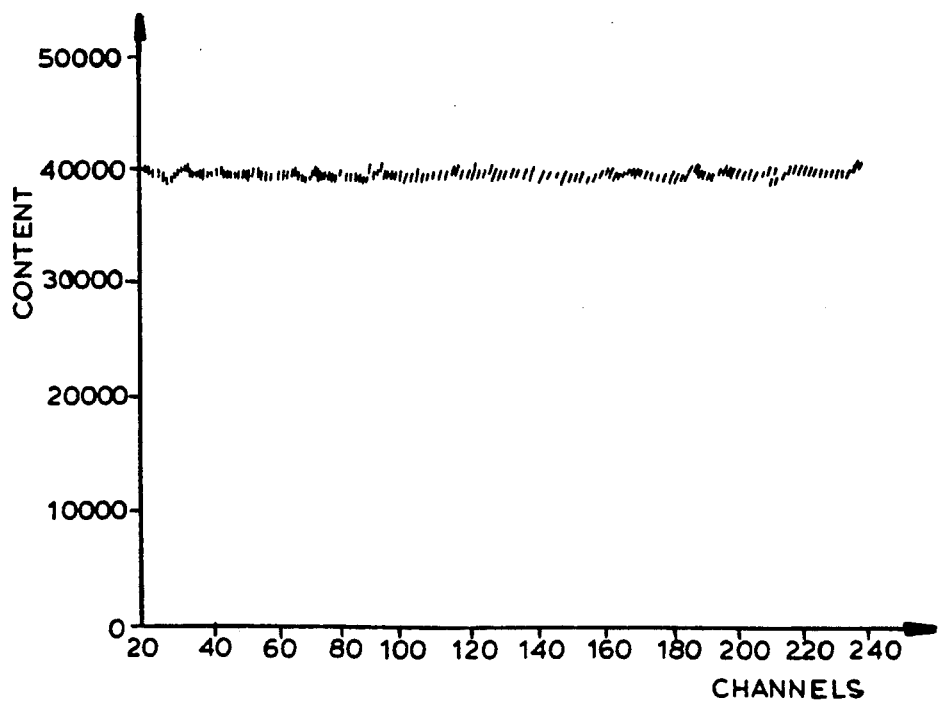
FIG. 2b is a plot of an averaged output of the dividing ADC.

With the circuit shown in FIG. 1 in which the dividing ADC is an 8-bit Flash ADC, pulses with a half value width of 100 ns can be divided without the use of a stretcher with averaging over 16 channels, a differential linearity of 2% is obtained (FIG. 2b) while without averaging the linearity was about 30% (FIG. 2a). The conversion time from division and digitalization of this averaging dividing ADC is subsequently smaller than the duration of the input signals supplied.

Figure 3:
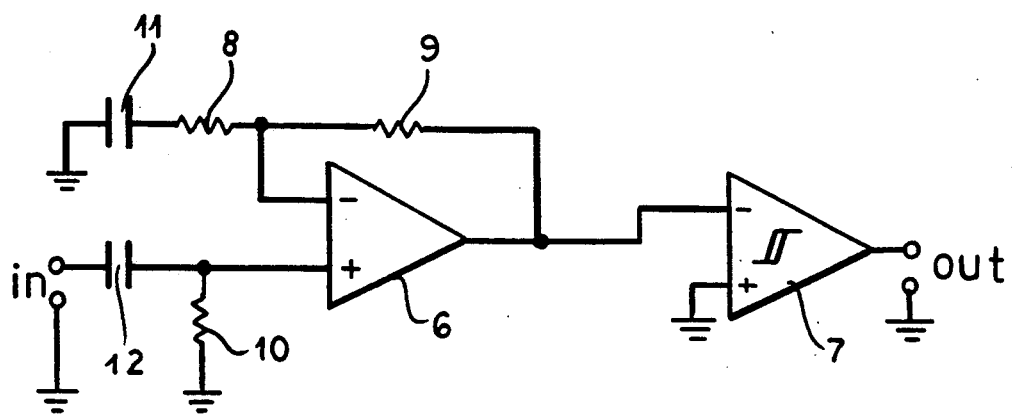
FIG. 3 is a circuit, diagram of the circuit used for differentiation of the pulse B in order to generate a trigger signal at pulse peak for timing purpose.

By mathematical differentiation of the pulses, preferably the divisor signal, the 0 passage of the so differentiated signals will coincide with the maxima of the input signals for the pulse processing, the input signals A and B can be delayed by the transit time of the differentiator. FIG. 3 shows an example of the differentiator utilizing an operational amplifier 6 and a discriminator 7, resistors 8, 9 and 10 and capacitors 11 and 12.

We claim:

1. A divider circuit for the division of an input signal A by a respective reference signal B, comprising:

a dividing analog-to-digital converter receiving said reference signal B as a divisor input;

a multiplying digital-to-analog converter having an input receiving said reference signal B and receiving a signal representing a digital value r corresponding to an analog value q selected for the respective input signal A and such that $(A+q\times B)/B$ lies in a dynamic range of said analog-to-digital converter, said multiplying digital-to-analog converter forming an analog output product $q\times B$;

an adder connected to said multiplying digital-to-analog converter and receiving as one input said input signal and as another input said product $q\times B$ to form a sum $(A+q\times B)$, said adder being connected to said dividing analog-to-digital converter to supply said sum as a dividend thereto whereby said dividing analog-to-digital converter has an output at which a digital quotient $(A+q\times B)/B$ is formed; and a subcontractor connected to said output of said dividing analog-to-digital converter for subtracting from said quotient $(A+q\times B)/B$ a digital signal representing said value r where r represents a whole number corresponding to the analog value q, whereby a digital output representing a difference $\{(A+q\times B)/B\}-r$ is formed as a result for division of said input signal A by the respective reference signal B.

2. The divider circuit defined in claim 1, further comprising an incrementable register for generating said signal r, said incrementable register being connected to said digital-to-analog converter and to said subtractor.

3. The divider circuit defined in claim 1 wherein said adder is an analog adder.

4. The divider circuit defined in claim 1 wherein said subtractor is a digital subtractor.

5. The divider circuit defined in claim 1 wherein said analog-to-digital circuit is a Flash analog-to-digital circuit.

6. A divider circuit as defined in claim 1, further comprising a storage register connected to said subtractor for storing said difference $\{(A+q\times B)/B\}-r$.

7. The divider circuit defined in claim 1 wherein said analog-to-digital converter is a multichannel ADC and the formation of said quotient uses a portion of said channels whereby, for a predetermined resolution $R = 2^n - 1$ of the analog-to-digital converter a value of r is randomly selected which lies between 0 and $2^m - 1$, where $m < n$, m and n are whole numbers.

8. The divider circuit defined in claim 7, further comprising an incrementable register for generating said signal r, said incrementable register being connected to said digital-to-analog converter and to said subtractor.

9. The divider circuit defined in claim 8 wherein said adder is an analog adder.

10. The divider circuit defined in claim 9 wherein said subtractor is a digital subtractor.

11. The divider circuit defined in claim 10 wherein said analog-to-digital circuit is a Flash analog-to-digital circuit.

12. A method of automatically dividing an input signal A by a respective reference signal B, comprising the steps of:

automatically supplying said reference signal B as a divisor input to a dividing analog-to-digital converter;

automatically multiplying in a multiplying digital-to-analog converter said reference signal B and a signal q representing an analog value of a selected digital value r for the respective input signal A and such that $(A + q \times B)/B$ lies in a dynamic range of said analog-to-digital converter, thereby forming an output product $q \times B$;

automatically generating in an adder connected to said multiplying digital-to-analog converter and receiving as one input said input signal A and as another input said product $q \times B$, a sum $(A + q \times B)$, said adder being connected to said dividing analog-to-digital converter to supply said sum as a dividend thereto whereby said dividing analog-to-digital converter has an output at which a digital quotient $(A + q \times B)/B$ is formed; and automatically subtracting from said quotient $(A + q \times B)/B$ the digital value r representing a whole number corresponding to the analog value q, whereby a digital output representing a difference $\{(A + q \times B)/B\} - r$ is formed as a result for division of said input signal A by the respective reference signal B.

* * * * *